(12) United States Patent
Morizane et al.

(10) Patent No.: US 6,218,606 B1
(45) Date of Patent: Apr. 17, 2001

(54) SOLAR CELL MODULE FOR PREVENTING REVERSE VOLTAGE TO SOLAR CELLS

(75) Inventors: Masashi Morizane, Hirakata; Toshio Yagiura, Kadoma; Kenji Murata, Kyotanabe; Takayoshi Yasuda, Hyogo; Nobuyuki Nishi, Kadoma, all of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/404,219

(22) Filed: Sep. 23, 1999

(30) Foreign Application Priority Data

Sep. 24, 1998 (JP) .................................................. 10-269776
Sep. 24, 1998 (JP) .................................................. 10-269777
Mar. 12, 1999 (JP) .................................................. 11-066877

(51) Int. Cl.$^7$ .......................... H01L 31/048; H01L 31/05
(52) U.S. Cl. .......................... 136/251; 136/244; 136/256; 136/293; 257/433; 257/443; 257/459
(58) Field of Search .......................... 136/244, 251, 136/256, 293; 257/433, 443, 459

(56) References Cited

U.S. PATENT DOCUMENTS 3,912,539 * 10/1975 Magee ................................. 136/244
5,248,346 * 9/1993 Fraas et al. ........................... 136/244
5,330,583 * 7/1994 Asai et al. ............................ 136/251
5,990,415 * 11/1999 Green et al. ......................... 136/255

FOREIGN PATENT DOCUMENTS

| 56-169287 | 5/1980 | (JP) . |
| 61-149356 | * 9/1986 | (JP) . |
| 2-140843 | 11/1990 | (JP) . |
| 3-1549 | 1/1991 | (JP) . |
| 5-160425 | 6/1993 | (JP) . |
| 3036405 | * 1/1997 | (JP) . |
| 9-53211 | 2/1997 | (JP) . |

* cited by examiner

Primary Examiner—Alan Diamond
(74) Attorney, Agent, or Firm—Arent Fox Kintner Plotkin & Kahn, PLLC

(57) ABSTRACT

A plurality of solar cell groups having a plurality of solar cells connected to each other electrically in serial. A plurality of diodes are connected to each of the solar cell groups electrically in parallel. The plurality of diodes are sealed between transmissive front surface members and transmissive rear surface members together with the plurality of solar cell groups.

10 Claims, 9 Drawing Sheets

SOLAR CELL MODULE FOR PREVENTING REVERSE VOLTAGE TO SOLAR CELLS

BACKGROUND OF THE INVENTION

1. Field of the Invention

The present invention relates to a solar cell module and more particularly relates to a solar cell module having front and rear surface members that are transmissive and which can let in light from both front and rear surfaces.

2. Description of the Prior Art

A solar cell can directly convert photo-energy from the sun that provides clean energy without depletion. Solar cell technology is expected to replace fossil fuel such as petroleum and coal. Since solar energy has been predicted to be the new energy source, a lot of effort has been made to commercialize solar cell technology. When using a solar cell as an energy source in practical general circumstances, a plurality of solar cells are connected electrically in serial or in parallel to increase output.

A description of a conventional solar cell module will be made by referring to FIGS. 13–16. FIG. 13 is a front view, FIG. 14 is a cross-sectional view at the A-A' line indicated in FIG. 13, and FIG. 15 is a rear elevation schematically illustrating a rear surface member which will be described later. FIG. 16 is an explanatory view illustrating an enlarged structure of an inside portion of a terminal box.

As shown in these figures, the solar cell module comprise of a front surface member 1 containing transmissive material such as glass and plastic, a rear surface member 2, and solar cells 3 . . . Generally a rear surface member 2 has a three-layered structure sandwiching an aluminum foil between resin films.

The solar cell 3 is, for example, one that contains crystalline Si substrate having p-n junction inside. Seventy-two units of solar cells 3 . . . are disposed in an 8×9 matrix shape and are connected electrically in serial with connection members 4 . . . containing a metal thin plate such as a copper thin plate. The solar cells 3 . . . are sealed between the front surface member 1 and the rear surface member 2 with sealing member 5, such as ethylene vinyl acetate (EVA), which is transmissive and insulated. A frame 6 formed by processable metal such as aluminum-is mounted around the sealing member.

Electricity generated in the solar cells 3 . . . is drawn to terminal boxes 50, 50 provided on a rear surface of the rear surface member 2 through electricity drawing wires 11, 11. Then, the electricity is output from the terminal boxes 50, 50 through an electric cable (not shown) to the outside.

In the above system which operates a plurality of solar cells connected in serial, the sunlight is sometimes prevented from being incident to a part of solar cells because of shade created from a building or snow drifts. In this case, a total voltage generated by the solar cells, which are normally operating, is applied to the above part of the solar cells as reverse voltage. If the reverse voltage reaches beyond a capacity voltage of the solar cells, the solar cells are broken. Otherwise, the above part of the solar cells generates heat, causing such problems as discoloration or foaming in the EVA sealing member or breakage of solar cells.

Thus, in order to overcome this problem, a common solar cell module has solar cells divided into several groups of a plurality of solar cells, and has means for preventing reverse voltage from being applied, which is connected to these solar cell groups in parallel.

For example, in the above solar cell module, 72 units of solar cells are divided into four groups of eighteen solar cells 3 . . . A diode 21, as means for preventing reverse voltage from being applied, is connected to these solar cell groups electrically in parallel and in reverse via connection wire 12. The diode 21, as shown in FIG. 16, is located in a terminal box 50, thus increasing the size of terminal box 50.

I the interim, a solar cell, which can generate energy from light which is incident not only from a front surface but from a rear surface, has been developed. A solar cell module, which employs such a solar cell that can take light from both front and rear surfaces, has a structure in which light can be incident to a rear surface of a solar cell through a rear surface member consisting of transmissive material such as glass rather than conventional material which is not transmissive.

However, in the solar cell module of the above structure, light which is incident from the rear surface is blocked by the terminal boxes 50, 50, the electricity drawing wires 11, 11, and the connection wires 12 . . . Because of the present configuration of the solar cell module light can not be incident to some parts of the rear surfaces of the solar cells. As a result, the solar cells of those parts generate electric current only by light which is incident from the front surface, and an electric current value of those parts becomes lower than others. Since a plurality of solar cells are connected electrically in serial, an output electric current value of the whole module becomes is lower for solar cells having the above configuration where light is not incident to the rear surface. Accordingly, light which is incident from the rear surface can not be utilized fully.

in addition to the above solar cell which can let in light from both front and rear surfaces, a solar cell module of sophisticated-design using a conventional solar cell, of which rear surface member is made of transmissive material and can transmit a part of light to the rear surface, has been provided. However, the terminal boxes 50, 50, electricity drawing wires 11, 11, and connection wires 12 . . . in such a solar cell module also reduce light transmitting through the rear surface, degrading an effect of the transmissive rear surface.

SUMMARY OF THE INVENTION

One object of the present invention is to solve the problems described above, and to provide a solar cell module which can let in light from both front and rear surfaces. Further, the solar cell module of the present invention has an increased area where light can be incident to improve power generating efficiency.

The solar cell module of the present invention comprises a plurality of solar cell groups connected each other electrically in serial, and a plurality of means for preventing reverse voltage from being applied connected to each solar cell group electrically in parallel. The plurality of means for preventing reverse voltage from being applied are sealed between transmissive front surface member and rear surface member together with the plurality of solar cell groups.

The solar cell module of the present invention does not need a conventional terminal box which blocks light which is incident from a rear surface. As a result, light which is incident from a rear surface can contribute fully to generating electricity. Further, the present invention can provide a solar cell module which can be manufactured at a low cost, and which is one of sophisticated design.

The solar cell group comprises a plurality of solar cells electrically connected each other, and a pair of open ends in the solar cell group is arranged on the same side, the plurality of solar cell groups are arranged so that each pair of open ends of the solar cell group is positioned on the same side, and means for preventing reverse voltage from being applied is disposed in an outer periphery of a side where the open ends are arranged.

The means for preventing reverse voltage from being applied, which is connected with the solar cell group electrically in parallel can be connected between a pair of open ends arranged on the same side of the solar cell group, to shorten a length of electric wire for connecting the means for preventing reverse voltage from being applied.

The solar cell group comprises of the plurality of solar cells arranged in even-number lines, and the plurality of solar cell groups are arranged in a vertical direction.

The means for preventing reverse voltage from being applied and conductor for electrically connecting the plurality of solar cell groups each other are arranged in a straight line.

In the solar cell of the above structure, an area occupied by the conductor and means for preventing reverse voltage from being applied, which do not contribute to generating power from incident light, can be shrunk. And a solar cell module for generating power effectively can be obtained.

The means for preventing reverse voltage from being applied is a diode. A thickness of the diode is preferably about the same as that of the solar cell or less than that of the solar cell.

The diode comprises a bare chip diode and conductive members mounted on both front and rear surfaces of the bare chip diode. Further, at least one of the conductive members has a first plane portion serving as a mounting surface, a support portion diving from the first plane portion, and a second plane portion bending from the support portion to be in parallel to the first plane portion.

In this structure, the support portion can support the diode and reduce the pressure applied to the diode when manufacturing a solar cell module. Thus, the structure could prevent breakage of the diode.

The diode comprises a bare chip diode and conductive members mounted on both front and rear surfaces of the bare chip diode. Further, the conductive member has a mounting portion serving as a mounting surface, and a base portion being superior in releasing heat and being formed in one piece with the mounting portion in an outer periphery of the bare chip diode.

In this structure, the base portion can support the diode and reduce the pressure applied to the diode when manufacturing a solar cell module. Thus, the structure could prevent breakage of the diode.

The solar cell module of the present invention comprises a transmissive front surface member, a rear surface member, a plurality of solar cells electrically connected each other and sealed between the transmissive front surface member and the rear surface member, and a terminal box for outputting electric power generated in the plurality of solar cells. The terminal box is mounted in an outer periphery of the plurality of solar cells on a rear side of the rear surface member.

The plurality of solar cells are divided into a plurality of solar cell groups, and the terminal box has means for preventing reverse voltage from being applied which is connected to each solar cell group electrically in parallel and is arranged in a straight line.

The plurality of solar cells are arranged in a matrix shape, the solar cell groups are divided by solar cells arranged in even-number lines, and the terminal box is mounted in an outer periphery of a horizontal direction of the solar cells arranged in a matrix shape.

The terminal box is mounted on a rear surface of the rear surface member and in an outer periphery of the solar cells. Thus, the terminal box does not block light which is incident from the rear surface, and the light can fully contribute to generating electricity. In addition, the size of the terminal box is small and the wire laid to the terminal box is short, therefore, the solar cell module of the present invention can be one of sophisticated design.

It is preferred to make the rear surface member transmissive so as that the solar cell can generate electric power by let in light from both front and rear surfaces.

The foregoing and other objects, features, aspects and advantages of the present invention will become more apparent from the following detailed description of the present invention when reviewed in conjunction with the accompanying drawings.

DESCRIPTION OF THE PREFERRED EMBODIMENTS

Explanation will be made of a solar cell module according to the embodiments of the present invention by referring to FIGS. 1–3.

Figure 1:
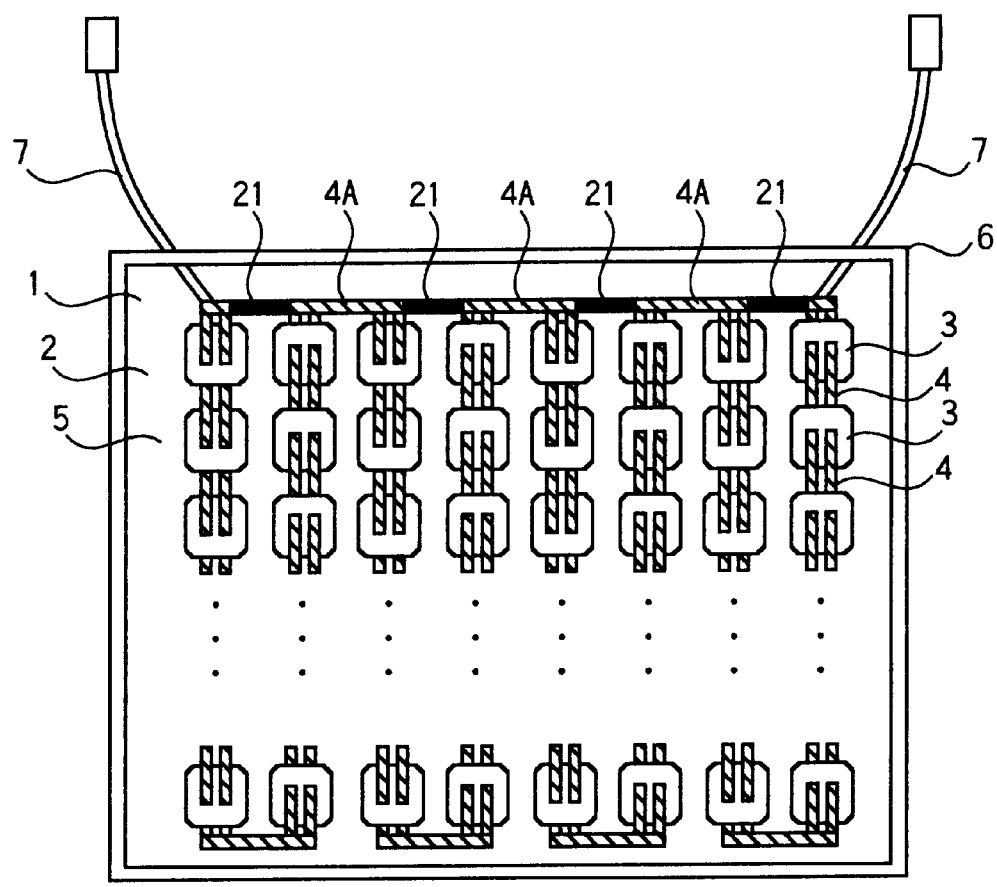
FIG. 1 is a front view illustrating a solar cell module according to a first embodiment of the present invention.
Figure 2:
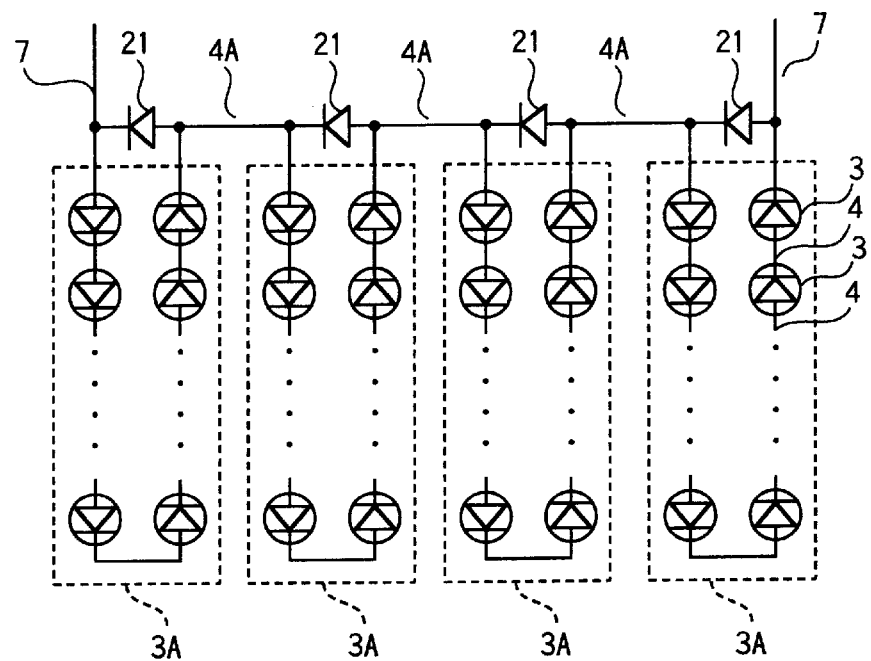
FIG. 2 is an equivalent circuit of a solar cell module according to a first embodiment of the present invention.

FIG. 1 is a front view illustrating a solar cell module according to a first embodiment of the present invention. FIG. 2 is an electric circuit diagram of a solar cell module in FIG. 1. FIG. 3 is a cross-sectional view illustrating a structure of a solar cell described in this embodiment. In these figures, elements, which have the same function as in FIGS. 13–16, have the same reference numerals as in FIG. 13–16.

A transmissive glass having external dimensions 1300× 875 mm is used as a front surface member 1 in this embodiment. Also, as a rear surface member 2, transmissive glass having the same dimensions as those of the front surface member is used, to compose a module structure where light can be incident from both surfaces. The rear surface member 2 is not limited to glass, and can be transmissive plastic etc. In using such transmissive plastic materials, it is preferable to employ a material of a lower vapor transmission rate in order to protect a module from moisture. A material having a vapor transmission rate less than 20 $g/m^2$ day is preferred. A material having a vapor transmission rate less than 0.1 $g/m^2$ day is further preferred. A value of a vapor transmission rate is measured by a MOCON method according to JISZ0208-73.

A solar cell 3 in this embodiment can let in light from both front and rear surfaces to generate electricity.

Figure 3:
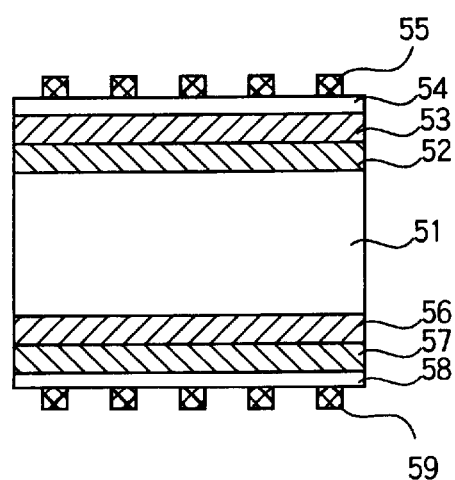
FIG. 3 is a cross-sectional view illustrating a structure of a solar cell which can let in light from both front and rear surfaces.

FIG. 3 is a cross-sectional view illustrating a structure of the solar cell which can let in light from both front and rear surfaces. As shown in this figure, an i-type layer 52 containing intrinsic amorphous silicon of approximately 100 Å in thick, and a p-type layer 53 containing amorphous silicon of approximately 100 Å in thick are laminated on a front surface of an n-type crystalline silicon substrate 51. Further, a transmissive electrode on a front surface 54 containing transmissive conductive film such as ITO, ZnO, $SnO_2$ etc., and a collecting electrode on a front surface 55 containing comb-shaped metal are formed on the p-type layer 53.

An i-type layer 56 containing intrinsic amorphous silicon of approximately 100 Å in thick, and an n-type layer 57 containing amorphous silicon of approximately 100 Å in thick are laminated on a rear surface of the n-type crystalline silicon substrate 51. Further, a transmissive electrode on a rear surface 58 containing transmissive conductive film such as ITO, ZnO, $SnO_2$ etc., and a collecting electrode on a rear surface 59 containing comb-shaped metal are formed on the n-type layer 57.

In the above mentioned solar cell, light which is incident not only from a front surface but also from a rear surface, is incident to the crystalline silicon substrate 5 and an electron and a hole are formed in the substrate 51, contributing to power generation.

The solar cell is not limited to one that is formed by combining crystalline and amorphous semiconductor material. The solar cell can also be one that contains crystalline semiconductor material or amorphous semiconductor material alone.

In the solar cell module of this embodiment, 12 units of solar cells 3 . . . are arranged in a vertical direction (upper and bottom directions in the figure) and 2 units of solar cells 3 . . . are arranged in a horizontal direction (right and left directions in the figure) in a matrix shape. Then, these 24 units of solar cells 3 . . . are connected electrically in serial by connection members 4 . . . containing a metal thin plate such as copper, to form a group of solar cells 3A. Further, the groups of solar cells 3A . . . are arranged in a horizontal direction and are connected electrically in serial by conductors 4A . . . containing a metal thin plate each other.

Diodes 21 are provided as a means for preventing reverse voltage from being applied and are connected with each solar cell group 3A . . . electrically in parallel and oppositely. Diodes 21 area also arranged in a straight line with the conductors 4A . . .

A conventional module has a diode arranged within a terminal box. However, as described above, the diodes 21 of the present invention are sealed between the front and rear surface members 1 and 2 together with the solar cell groups 3A . . . Accordingly, electric power cables 7, 7 for outputting power generated in the solar cells are not necessary to be guided via a terminal box, and can be guided outside from between the front and rear surface members 1 and 2.

The solar cell module of the present invention does not need a conventional terminal box which blocks light that is incident to a rear surface. As a result, the light which is incident to a rear surface can contribute fully to generating electricity. Further, the present invention can provide a solar cell module which can be manufactured at a low cost, and which has a sophisticated design.

The solar cell groups 3A . . . of this embodiment comprise 24 units of solar cells 3 . . . arranged in two lines, and the solar cells are linked by wire in serial and the linkage starts and ends on the same side. Thus, electrically positive and negative open ends of a group of solar cells 3A1 that is, an open end on a positive side and an open end on a negative side, are arranged on the same side. The diode 21 which is electrically connected with the solar cell group 3A in parallel can be connected between a pair of open ends arranged on the same side of the solar cell group 3A to shorten a length of electric wire needed for connecting the diode 21.

Further, each solar cell group 3A . . . is arranged in a horizontal direction so as to arrange each pair of open ends of the solar cell groups 3A . . . on the same side. Thus, as shown in FIGS. 1 and 2, the conductors 4A . . . and diodes 21 . . . for connecting the solar cell groups 3A . . . with each other electrically in serial can be arranged in a straight line.

As found in the above description, an area occupied by the conductors 4A . . . and diodes 21 . . . as an ineffective area, which do not contribute to generating power from incident light, can be shrunk. Thus, a solar cell module for generating power effectively can be obtained.

When connecting the diodes 21, the diodes 21 . . . can be connected after connecting the solar cell groups 3A . . . electrically in serial by the conductors 4A . . . It is also possible to reverse the order of these procedures. When arranging in a straight line and connecting the diodes 21 and the conductors 4A . . . , the conductors 4A . . . and the diodes 21 . . . should be connected alternately to form a linear- or zonary-shape and should be connected to the solar cell groups 3A . . . By these processes, electric connection between the solar cell groups 3A . . . and electric connection between the diode 21 . . . can be carried out simultaneously, shortening the time necessary for wiring.

In arranging a pair of electrical open ends of the solar cell groups 3A together on the same side, a structure is not limited to the above one in which the solar cell groups 3A comprise a plurality of solar cells 3 . . . arranged in two lines. It is also possible to arrange solar cells in lines of even-number.

In conjunction with this, an example is described as follow.

Figure 4:
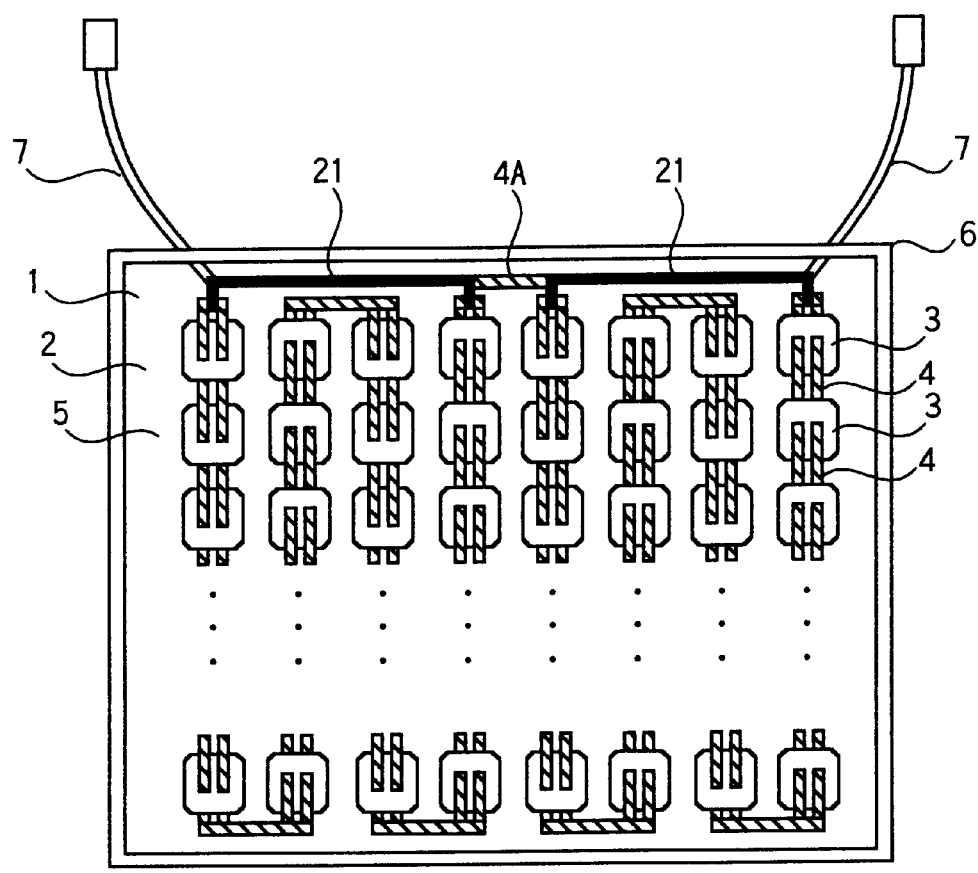
FIG. 4 is a front view illustrating a solar cell module according to a second embodiment of the present invention.
Figure 5:
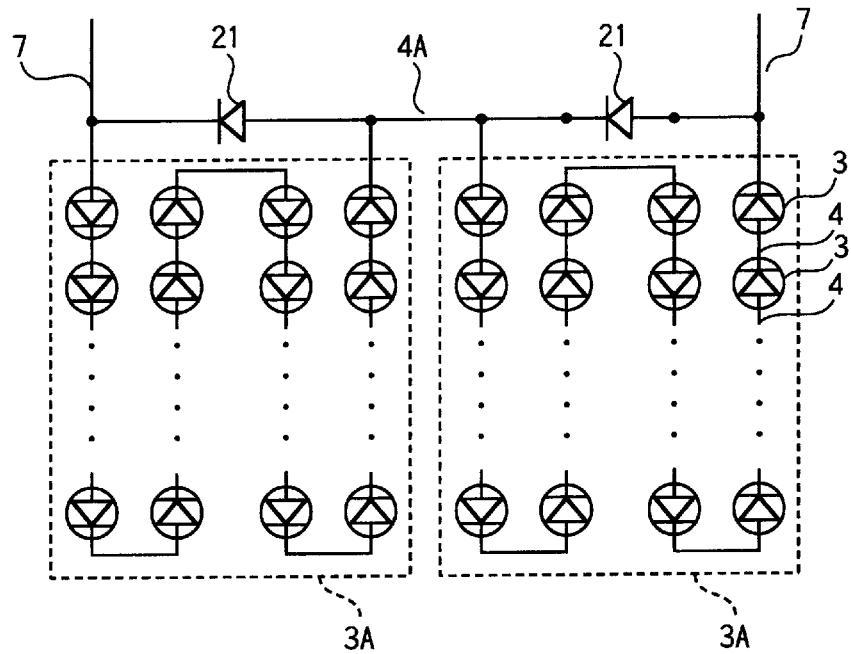
FIG. 5 is an equivalent circuit of a solar cell module according to a second embodiment of the present invention.

FIGS. 4 and 5 describe a solar cell module according to a second embodiment of the present invention. FIG. 4 is a front view illustrating a solar cell module according to this embodiment, and FIG. 5 is an equivalent circuit of a solar cell.

The second embodiment is different from the first embodiment in that the solar cell groups 3A . . . are comprised of solar cells 3 . . . arranged in four lines. In this solar cell module, conductors 4A . . . and diodes 21 . . . can be arranged in an outer periphery on the same vertical side of the solar cells (upper and bottom direction in the drawing). Thus, it is not necessary to lay wire around the inside of the module for connecting diodes 21 (a copper thin plate 34 in FIG. 6). Thus, the length of wire can be minimized. Furthermore, an area occupied by the diodes 21, as an ineffective area, which do not contribute to generating power from incident light, can be minimized increasing the efficiency in generating power.

A structure is not limited to the above one in which the solar cell groups 3A comprises a plurality of solar cells 3 . . . arranged in four lines. It is also possible to arrange solar cells in 2n lines (n is an integer more than two).

A description of a diode, as a means for preventing reverse voltage from being applied, used in the solar cell module of the present invention follows.

Figure 6:
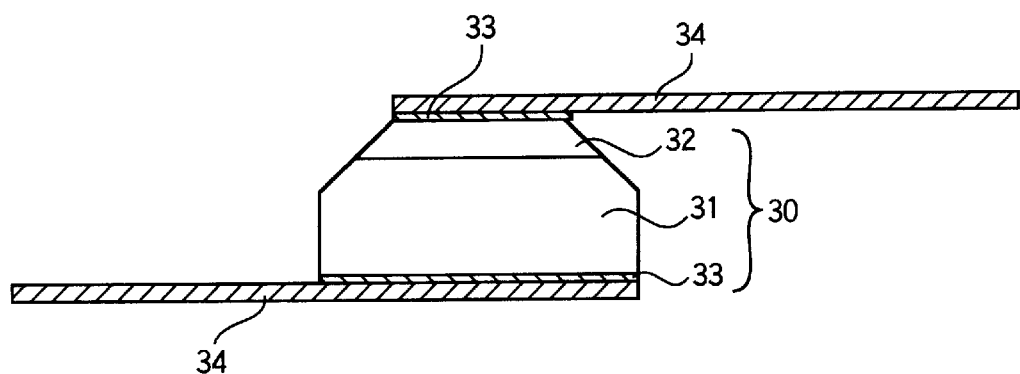
FIG. 6 is a cross-sectional view illustrating a structure of a diode as means for preventing reverse voltage from being applied of the present invention.

FIG. 6 is a cross-sectional view illustrating a structure of a diode in this invention, as a means for preventing reverse voltage from being applied.

As shown in this figure, the diode 21 has a structure in which conductive members 34,34 containing a conductive thin plate such as a copper thin plate are mounted on both upper and bottom surfaces of a bare chip diode 30 containing crystalline silicon (Si). The conductive member 34 is mounted for electrically connecting with the above conductor 4A. The conductor 4A can be co-used with the conductive member 34.

The bare chip diode 30 has an n-type layer 31 and a p-type layer 32 inside. The conductive members 34, 34 contain a copper thin plate sandwich adhesive layers 33, 33 being conductive such as solder, and are mounted on a bottom surface of the n-type layer 31 and on an upper surface of the p-type layer 32.

This embodiment employs a 3.5×3 5 mm bare chip diode, and 4×39 mm conductive members 34, 34 are mounted on both surfaces of the bare chip diode.

If the thickness of the diode 21 including the conductive member 34 is greater than the solar cell 3 including the connection member 4, it causes some problems. The diode is subjected to intense pressure during the manufacture of the solar cell module. The front surface member and a rear surface member interpose pressure on the solar cells connected with the diodes via an EVA sheet. When pressure is applied, the pressure sometimes causes diode 21 to break.

In the meantime, the conductive members 34, 34, used as a means for providing electrical connections also have another role, which is to release heat generated in the bare chip diode 30 when electric current flows. When electric current flows, the bare chip diode 30 generates heat. If the heat is too high, it brings harmful effects to the adhesive layer 33, the sealing member 5, the solar cells 3, etc. For example, conductivity or adhesiveness of the adhesive layer 33 becomes weak and the sealing member or the solar cells 3 . . . degrade.

In order to prevent such problems, heat generated in the bare chip diode 30 should be released via the conductive members 34, 34, to keep the temperature of the diode 21 less than 80° C. Thus, the conductive member 34 of a copper thin plate having the above mentioned length and width is required to be more than 0.5 mm in thick.

However, when the conductive layer is more than 0.5 mm in thick, the diode 21 is 1.35 mm in thick, and it causes breakage of the diode 21 when manufacturing the solar cell module. A structure of the diode 21, which could avoid such a problem, is illustrated in FIGS. 7 and 8.

Figure 7:
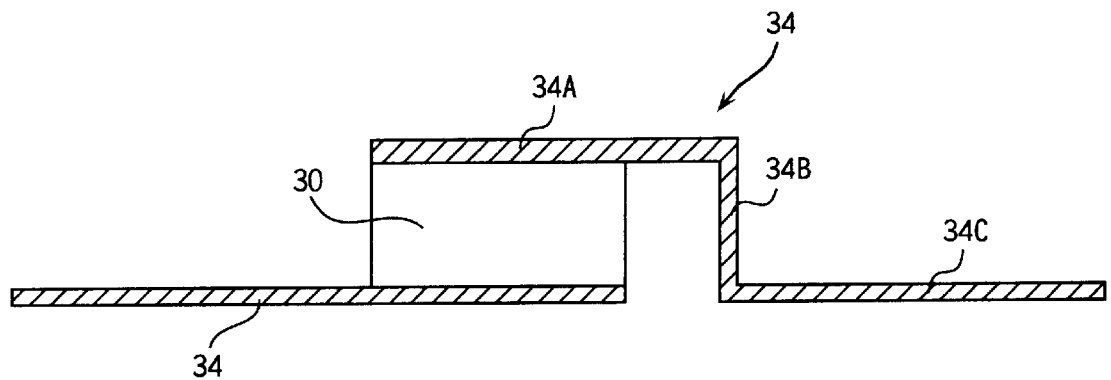
FIG. 7 is a cross-sectional view illustrating a structure of another diode as means for preventing reverse voltage from being applied of the present invention.

In FIG. 7, at least one of the conductive members 34, 34 mounted on an upper or bottom surface of the bare chip diode, has a first plane portion 34A which serves as a surface to be mounted on the bare chip diode 30, a support portion 34B which extends from one end of the plane portion 34A, and a second plane portion 34C which is bent to be approximately parallel to the plane portion 34A.

In this structure, the support portion 34B can support the diode 21 and reduce the pressure applied to the diode 21 when manufacturing a solar cell module. Thus, the structure could prevent breakage of the diode 21.

Figure 8:
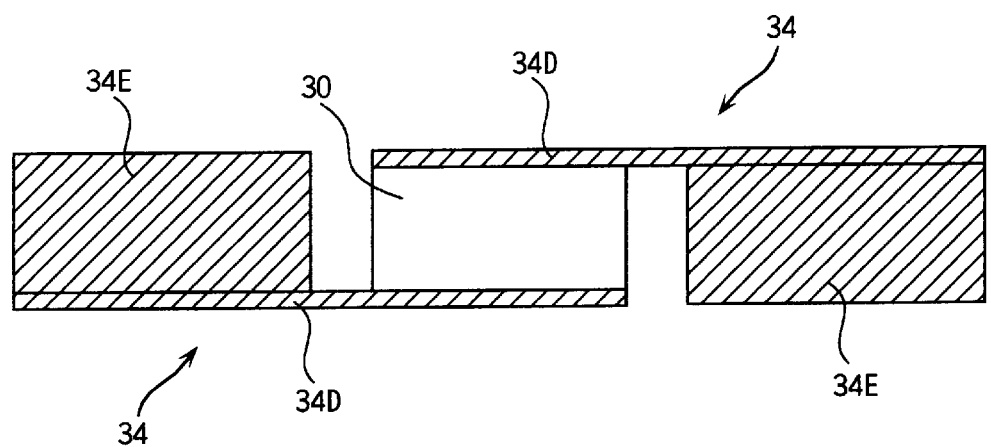
FIG. 8 is a cross-sectional view illustrating a structure of another diode as means for preventing reverse voltage from being applied of the present invention.

In FIG. 8, the conductive member 34 comprises a mounting portion 34D where conductive member 34 is mounted to the bare chip diode 30, and a base portion 34E which contains material that is superior in releasing heat and which are incorporated with the mounting portion 34D at the outer side of the bare chip diode 50. The conductive member 34 can be formed by gluing the mounting portion 34D and the base 34E, which are separately formed, together, or by incorporating them in one piece.

In this structure, the base portion 34E can support the diode 21 and reduce the pressure applied to the diode 21 when manufacturing a solar cell module.

Heat generated in the bare chip diode 30 is released at the base portion 34E via the mounting portion 34D. The thickness of the base portion 34E can be approximately the same as that of the bare chip diode 30, thus the thickness of the mounting portion can be less than that in the structures in FIGS. 6 and 7. For example, when the thickness of the bare chip diode 30 is about 0.35 mm, the thickness of the base portion 34E can be approximately 0.5 mm, thus the thickness of the mounting portion 34D becomes about 0.15 mm.

The thickness of the diode 21 is measured as 0.35 mm±0.15 mm+0.15 mm=0.65 mm, and can be half of the conventional one (1.35 mm). Accordingly, the thickness of the diode 21 would be approximately the same as that of the solar cell 3, and it can reduce the pressure applied to the diode 21 in manufacturing a solar cell module in comparison with the conventional structure. This structure can dramatically reduce possible breakage of the diode 21 than the structures in FIGS. 6 and 7.

The solar cell module of the present invention has a structure in which means for preventing reverse voltage from being applied is sealed together with the solar cell groups between the front and rear surface members. This structure can realize a solar cell module at a low cost. Furthermore, when the present invention is applied to a solar cell module, which uses a solar cell that can let in light from both front and rear surfaces, light which is incident from a rear surface can be utilized and the power generating efficiency is improved. Also, when the present invention is applied to a solar cell module, which uses a conventional solar cell which can let in light from both front and rear surfaces, a solar cell module having a sophisticated design can be realized.

When a structure of a diode, as means for preventing reverse voltage from being applied, as illustrated in FIGS. 7 and 8 are utilized, breakage of the diode in manufacturing a module can be reduced leading to higher production yield.

As in the above description, the electric power cable is guided from between the front and rear surface members 1 and 2. However, it is not limited to this structure. The cable can be guided via a perforated hole formed on the rear surface member, or the cable can be guided via a terminal portion formed on a side or rear surface of the rear surface member. These structures can also reduce the size of the terminal portion dramatically in comparison with a conventional terminal box resulting in the same effects as previously described.

A means for preventing reverse voltage from being applied is not limited to a diode as described above, but could be any component that can bring the same effect.

A description of a solar cell module according to a third embodiment of the present invention by referring to FIGS. 9–12 follows.

Figure 9:
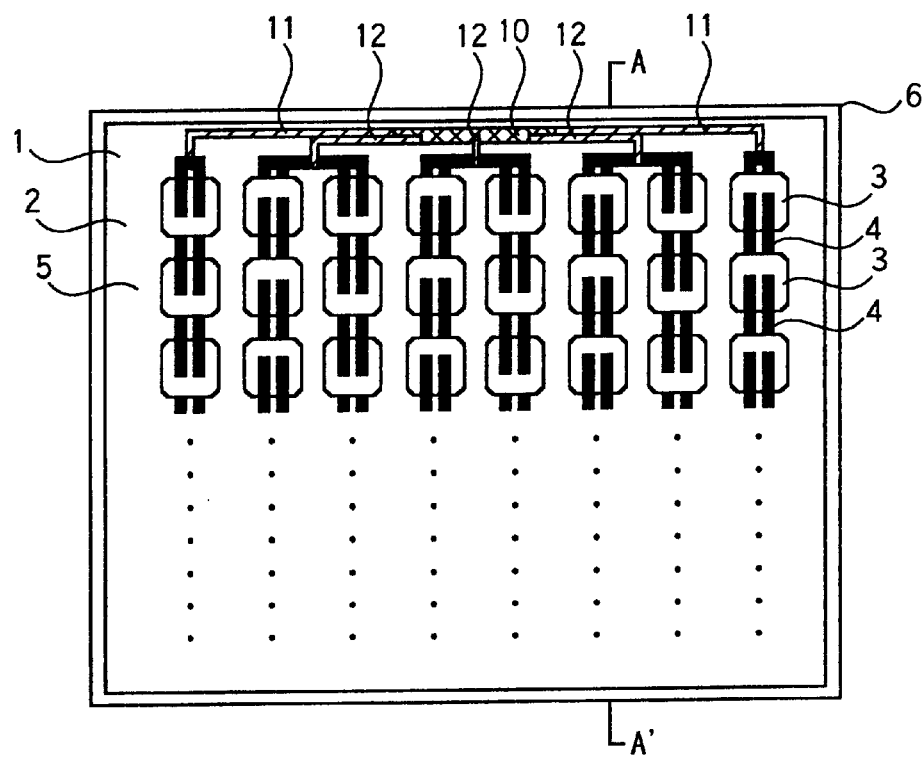
FIG. 9 is a front view illustrating a solar cell module according to a third embodiment of the present invention.
Figure 10:
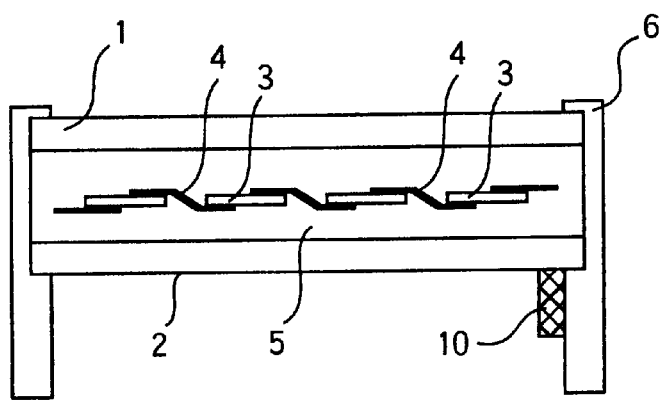
FIG. 10 is a cross-sectional view at the A-A' line indicated in FIG. 9.
Figure 11:
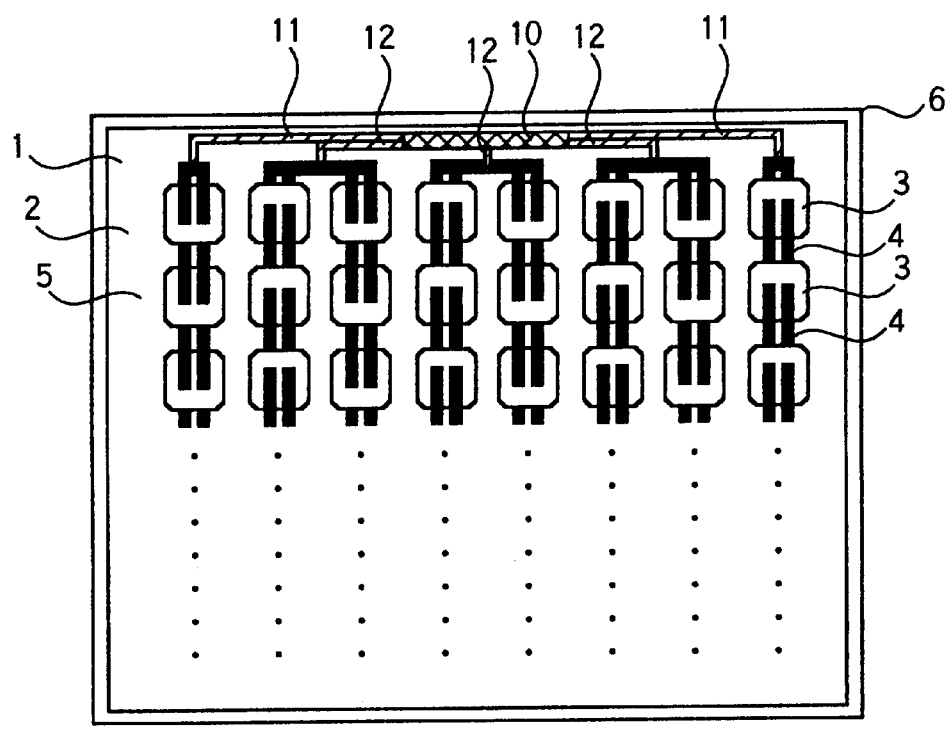
FIG. 11 is a rear elevation.
Figure 12:
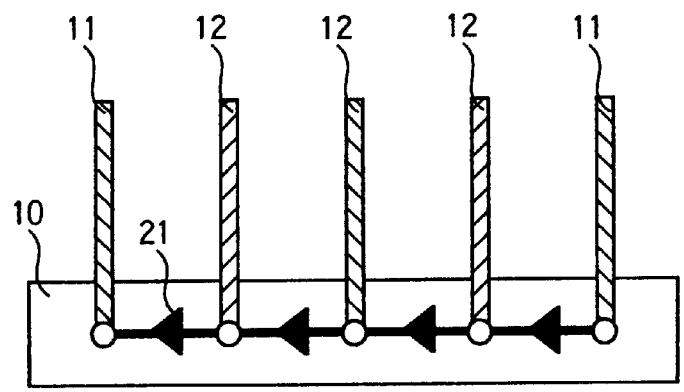
FIG. 12 is a view illustrating a structure of a terminal box.
Figure 13:
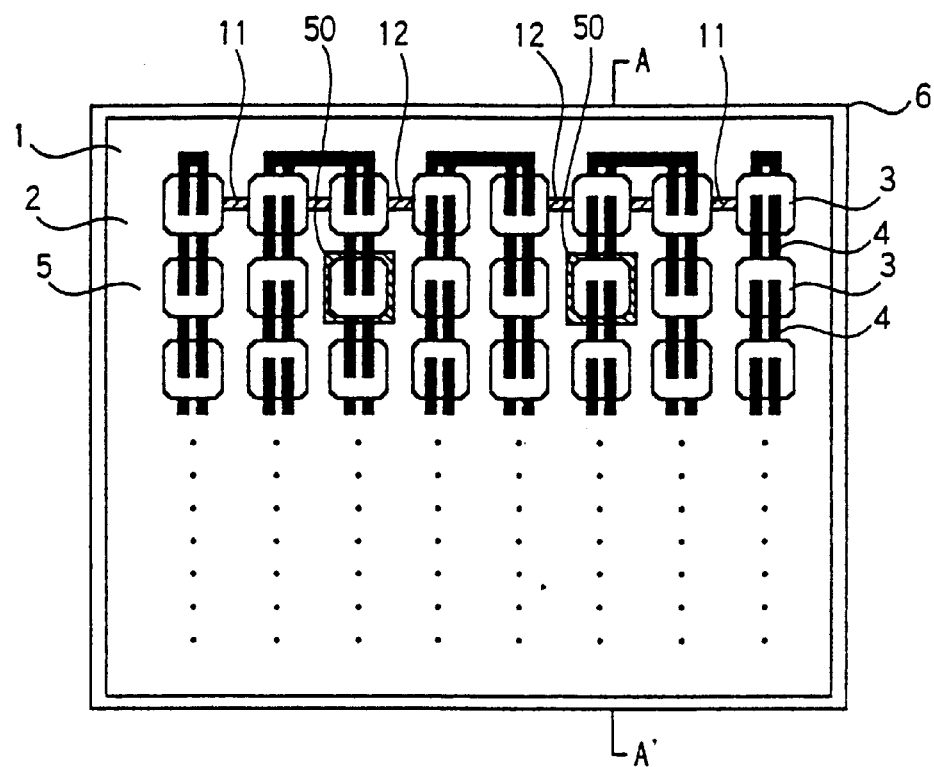
FIG. 13 is a front view illustrating a conventional solar cell module.
Figure 14:
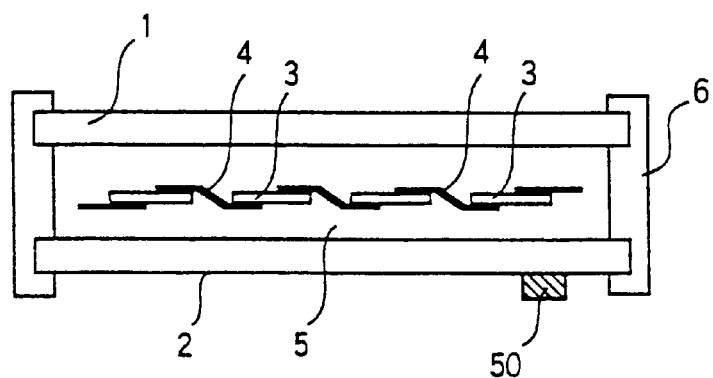
FIG. 14 is a cross-sectional view at the B-B' line indicated in FIG. 13.
Figure 15:
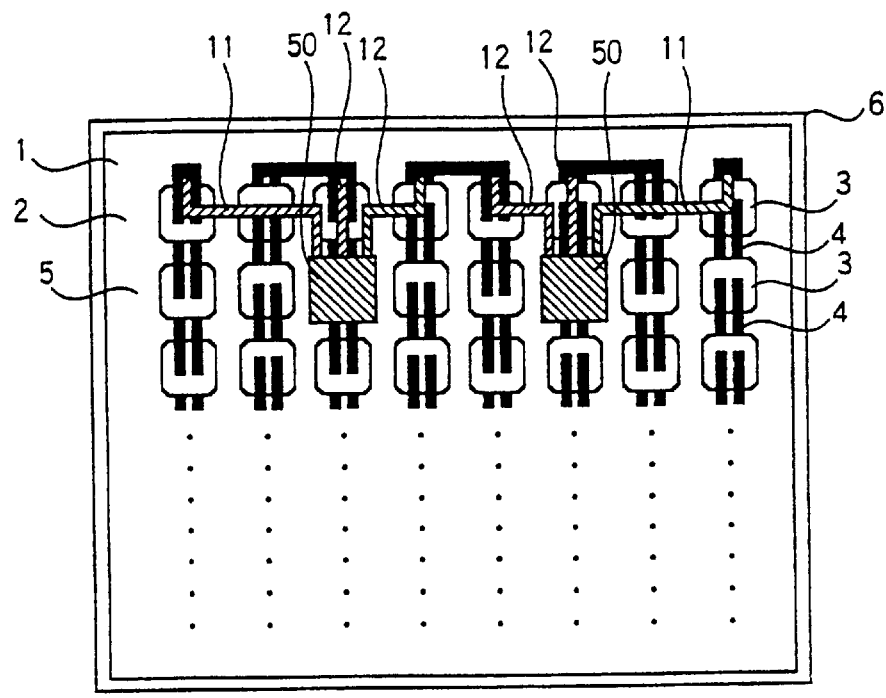
FIG. 15 is a rear elevation of a conventional solar cell module.
Figure 16:
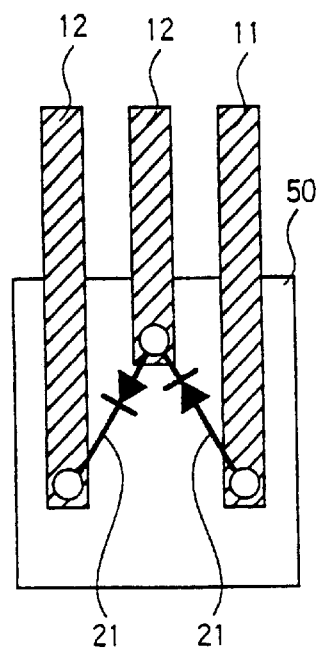
FIG. 16 is a view illustrating a structure of a conventional terminal box.

FIG. 9 is a front view illustrating a solar cell module according to the third embodiment of the present invention. FIG. 10 is a cross-sectional view at the A-A' line indicated in FIG. 9. FIG. 11 is a rear elevational view. FIG. 12 is a view illustrating a structure of a terminal box. In these figures, elements, which have the same function as in the above embodiment, have the same reference numerals.

Transmissive glass having external dimensions 1300×875 mm is used as a front surface member 1 in this embodiment. A rear surface member 2 made of transmissive glass having the same dimensions as those of the front surface member 1 is also used to compose a module structure where light can be incident from both surfaces. The rear surface member 2 is not limited to glass, and can be transmissive plastic etc. In using such transmissive plastic materials, it is preferable to employ a material of a lower vapor transmission rate in order to protect a module from moisture. A material having a vapor transmission rate less than 20 g/m$^2$ day is preferred. A material having a vapor transmission rate less than 0.1 g/m$^2$ day is further preferred. A value of a vapor transmission rate is measured by the Mocon method according to JISZ0208-73.

A solar cell 3 in this embodiment can let in light from both front and rear surfaces and generate electricity. The solar cell illustrated in FIG. 3 can be also applied in the third embodiment.

A solar cell is not limited to one that is formed by combining crystalline and amorphous semiconductor material. A solar cell can be one that contains crystalline semiconductor material or amorphous semiconductor material alone.

In this embodiment, 12 units of the solar cells are arranged in a vertical direction (an upper and bottom direction in the figure) and 8 units in a horizontal direction (a right and left direction in the figure) to form a matrix shape. Each solar cell 3 . . . is connected electrically in serial by connection members 4 . . . containing a copper thin plate.

A terminal box 10 is mounted on a rear surface side of the rear surface member 2 and in a position, which is on an outer periphery of the solar cells 3 . . . arranged in a matrix shape. The terminal box is fixed to a frame 6 by a fixing means such as screws, etc. Electric power generated in the solar cells 3 . . . is drawn by electricity drawing wires 11, 11 to the terminal box 10.

The 96 units of solar cells are divided into four groups of 24 units of solar cells 3 . . . , each group comprising two lines of 12 units of solar cells. A bypass diode 21 is electrically connected to these solar cell groups in parallel via connection wire 12.

In this case, electricity drawing wires 11, 11 and connection wire 12 . . . are arranged to be adjacent with each other around the terminal box 10. In conjunction with this, it should be noted that each wire would not be short-circuited. Thus, it is preferred to provide an insulating film such as polyethylene terephthalate (PET) film between each wire.

These bypass diodes 21 . . . are arranged within the terminal box 10 as in the conventional structure. In this embodiment, the bypass diodes 21 . . . are arranged in a straight line and the terminal box 10 is in a long and narrow rectangular shape. By employing a long and narrow rectangular shape, the terminal box 10 can be arranged in a periphery of the solar cells 3 . . . arranged in a matrix shape, and light which is incident from a rear surface can enter a rear surface of the solar cells 3 . . . without being blocked by the terminal box 10. In addition, the size of the terminal box 10 can be as small as approximately 210 mm×15 mm, and the terminal box can be produced at lower cost than a conventional structure, resulting in the lower total production cost of a solar cell module.

In this embodiment, the solar cells 3 . . . are arranged in even-number lines to form a matrix shape, and are connected with the bypass diodes 21 by even-number lines (by two lines in this embodiment).

The electricity drawing wires 11, 11 and the connection wire for bypass diodes 12 . . . can be guided out from the same side of the solar cells 3 . . . arranged in a matrix shape (ie from the end of the vertical line of the matrix-shaped solar cell group, as shown in FIGS. 9 and 11). Thus, the terminal box 10 can be disposed in an outer periphery of the vertical line where these wires are guided out and the length of the wires 11 and 12 can be reduced, resulting in a lower production cost. It is also noted that these wires do not block light which is incident from the rear surface. Furthermore, it is not necessary to lay the wires 11 and 12, preventing the connection wire 12 and the solar cell 3 from being short-circuited.

The terminal box is mounted on a rear surface of the rear surface member and in an outer periphery of the solar cells. Thus, the terminal box does not block light which is incident from the rear surface, and the light which is incident from the rear surface can fully contribute to generating electricity. In addition, the size of the terminal box is small and the wire laid to the terminal box is short, therefore, the solar cell module of the present invention can be one of sophisticated design.

Although the description was made on a solar cell module by which light can be incident from both front and rear surfaces, the present invention can be applied to a conventional solar cell module which uses a rear surface member that can not let in light. In such a case, the size of a terminal box can be reduced, and the wire laid to a terminal box can be shortened. Thus, lower production cost can be achieved.

As described above, the present invention can provide a solar cell module by which light can be incident from both front and rear surfaces improving power generation, efficiency, and providing a sophisticated design.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What is claimed is:

1. A solar cell module comprising:
    a plurality of solar cell groups connected to each other electrically in serial,
    wherein each solar cell group comprises:
        a plurality of solar cells electrically connected to each other;
        a pair of open ends in each solar cell group is arranged on the same side of the module, and said Plurality of solar cell groups are arranged so that each said pair of open ends of each solar cell group is positioned on the same side of the module, and a plurality of means for preventing reverse voltage from being applied connected to each solar cell group electrically in parallel in a straight line on an outer periphery of the side where the open ends are arranged, wherein said plurality of means for preventing reverse voltage from being applied are sealed between a transmissive front surface member and a transmissive rear surface member together with said plurality of solar cell groups.

2. The solar cell Module according to claim 1, wherein each solar cell group comprises said plurality of solar cells arranged in even-number lines, and said plurality of solar cell groups are arranged in a horizontal direction.

3. The solar cell module according to claim 1, wherein said means for preventing reverse voltage from being applied is a diode.

4. The solar cell module according to claim 3, wherein a thickness of said diode is approximately the same as or less than that of a solar cell of said plurality of solar cell groups.

5. The solar cell module according to claim 3, wherein said diode comprises a bare chip diode and conductive members mounted on both front and rear surfaces of the bare chip diode and, further at least one of said conductive members has a first plane portion serving as a mounting surface, a support portion diving from the first plane portion, and a second plane portion bending from the support portion to be in parallel to said first plane portion.

6. The solar cell module according to claim 3, wherein said diode comprises a bare chip diode and conductive members mounted on both front and rear surfaces of the bare chip diode and, further said conductive member has a mounting portion serving as a mounting surface, and a base portion being superior in releasing heat and being formed in one piece with the mounting portion in an outer periphery of said bare chip diode.

7. A solar cell module comprising;

a transmissive front surface member, a rear surface member, a plurality of solar cells electrically connected and sealed between the transmissive front surface member and the rear surface member, and a terminal box for outputting electric power generated in said plurality of solar cells, wherein said terminal box is mounted in an outer periphery of said plurality of solar cells on a rear side of said rear surface member wherein said plurality of solar cells are divided into a plurality of solar cell groups, and said terminal box has means for preventing reverse voltage from being applied which is connected to each solar cell group electrically in parallel and is arranged in a straight line.

8. The solar cell module according to claim 7, wherein said plurality of solar cells are arranged in a matrix shape, said plurality of solar cell groups are divided by solar cells arranged in even-number lines, and said terminal box is mounted in an outer periphery of a vertical direction of said solar cells arranged in a matrix shape.

9. The solar cell module according to claim 7, wherein said rear surface member is transmissive.

10. The solar cell module according to claim 9, wherein said plurality of solar cells can generate electricity by letting in light from both front and rear surfaces.

\* \* \* \* \*